United States Patent [19]

McCann et al.

[11] Patent Number: 5,310,696

[45] Date of Patent: May 10, 1994

[54] CHEMICAL METHOD FOR THE MODIFICATION OF A SUBSTRATE SURFACE TO ACCOMPLISH HETEROEPITAXIAL CRYSTAL GROWTH

[75] Inventors: Patrick J. McCann; Glifton G. Fonstad, both of Arlington, Mass.

[73] Assignee: Massachusetts Institute of Technology, Cambridge, Mass.

[21] Appl. No.: 768,349

[22] Filed: Sep. 30, 1991

Related U.S. Application Data

[63] Continuation of Ser. No. 367,459, Jun. 16, 1989, abandoned.

[51] Int. Cl.$^5$ .................. H01L 21/20; H01L 21/265; H01L 21/324; H01L 21/84
[52] U.S. Cl. .................................. 437/84; 437/119; 437/964; 437/965; 437/126
[58] Field of Search ...................... 437/84, 132

[56] References Cited

U.S. PATENT DOCUMENTS

| | | | |
|---|---|---|---|
| 3,411,946 | 11/1968 | Tramposch | 427/12 |
| 3,589,936 | 6/1971 | Tramposch | 357/4 |
| 3,663,319 | 5/1972 | Rose | 437/89 |
| 3,783,009 | 11/1974 | Tramposch | 428/620 |
| 3,929,556 | 12/1975 | Pandey | 437/84 |
| 4,066,481 | 1/1978 | Manasevit et al. | 437/84 |
| 4,086,555 | 4/1978 | Krikorian et al. | 204/192.26 |
| 4,129,457 | 12/1978 | Basi | 437/250 |
| 4,177,221 | 12/1979 | Nishizawa | 156/606 |
| 4,235,662 | 11/1980 | Reitz | 156/612 |
| 4,276,186 | 6/1981 | Bakos et al. | 437/225 |
| 4,282,045 | 8/1981 | Jensen et al. | 148/33.3 |
| 4,357,183 | 11/1982 | Fan et al. | 156/612 |
| 4,469,527 | 9/1984 | Sugano et al. | 357/91 |
| 4,477,308 | 10/1984 | Gibson et al. | 156/603 |
| 4,546,376 | 10/1985 | Nakata et al. | 357/23.7 |
| 4,789,642 | 12/1988 | Lorenzo et al. | 437/24 |
| 4,820,652 | 4/1989 | Hayashi | 437/52 |
| 4,883,775 | 11/1989 | Kobayashi | 437/225 |
| 5,037,774 | 8/1991 | Yamawaki et al. | 437/84 |
| 5,063,166 | 11/1991 | Mooney et al. | 437/132 |

FOREIGN PATENT DOCUMENTS 2556503 6/1977 Fed. Rep. of Germany .
63-281420 11/1988 Japan .

OTHER PUBLICATIONS

"Dielectrics on Semiconductors" E. J. Himpsel, et al., Materials Science and Engineering, B1, (1988) 9-13.
"Orientation Filtering by Growth-Velocity Competition in Zone-Melting Recrystallization of Silicon on SiO$_2$" H. A. Atwater, et al., Appl. Phys. Lett. 43, (1983) 1126-1128.
"A Novel Heteroepitaxy Method of Ge Films on CaF$_2$ by Electron Beam Exposure" Seigo Kanemaru, et al., J. Appl. Phys. 68, (1988), 1060-1064.
"Advanced Cell Structures for Dynamic RAMs", Nicky C. C. Lu, IEEE Circuits and Devices Magazine, Jan. (1984), 27-35.
"Interface Characterization of Silicon Epitaxial Lateral Growth Over Existing SiO$_2$ for Three-Dimensional CMOS Structures" J. A. Friedrich, et al., IEEE, Electron Device Lett. 10, (1989), 144-146.
"Progress in Compound-Semiconductor-on-Silicon-Heteroepitaxy with Fluoride Buffer Layers", H. Zogg, et al., J. Electrochem. Soc. 136, (1989), 775-779.
"GaAs On Insulator-Its Growth and Applications", Seijiro Furukawa, et al., Proceedings of the 1988 Inter- (List continued on next page.)

*Primary Examiner*—M. Wilczewski
*Attorney, Agent, or Firm*—Florence Fusco McCann

[57] ABSTRACT

A chemical method for the modification of a substrate surface by compound formation to accomplish heteroepitaxial crystal growth is provided. This method enables the growth of semiconductors on insulators allowing fabrication of three dimensionally integrated devices. Devices include vertical FET's for DRAM storage cells, integrated diode laser/FET's, integrated detector/FET's, and common gate CMOS inverters.

21 Claims, 5 Drawing Sheets

OTHER PUBLICATIONS national Electronic Devices and Materials Symposium, Department and Institute of Electrical Engineering, National Sun Yat-Sen University, Kaohsiung, Taiwan (1988), 266-269.

"Deposition of a Si Monolayer on Sapphire Using an ArF Excimer Larse for Si Epitaxial Growth", M. Ishida, et al., J. Appl. Phys. 64, (1988), 2087-2091.

"Heteroepitaxy of Semiconductor-On-Insulator Structures: Si and Ge on $CaF_2$/Si (111)", R. W. Fathauer, et al. J. Appl. Phys. 60, (1986), 3886-3894.

"A Review of the Semiconductor Properties of PbTe, PbSe, PbS and PbO", Richard Dalven, Infrared Physics, 9, (1969), pp. 141-184.

"Thin-Film IV-VI Semiconductor Photodiodes", Physics of Thin Films, 11, (1980), p. 116.

"Epitaxial Films of Germanium Deposited on Sapphire via Chemical Vapor Transport", R. F. Tramposch, J. Electrochem. Soc.: Solid State Science, 116, 654, (1969).

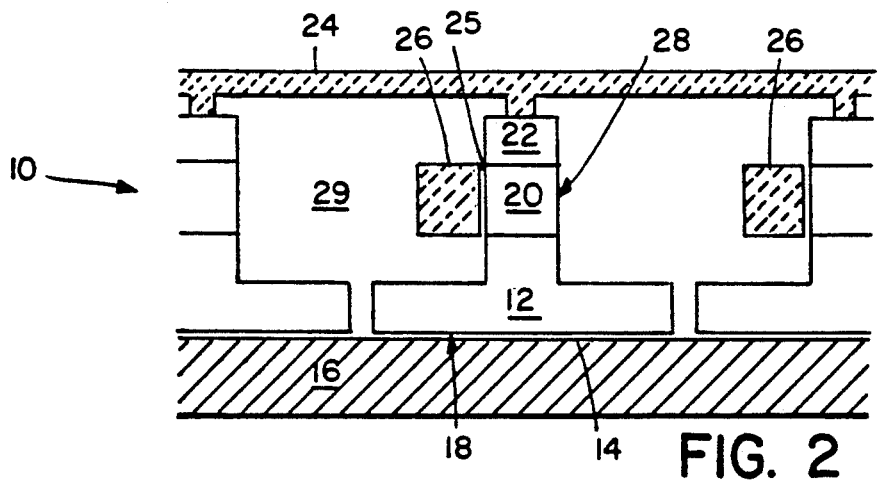
FIG. 2
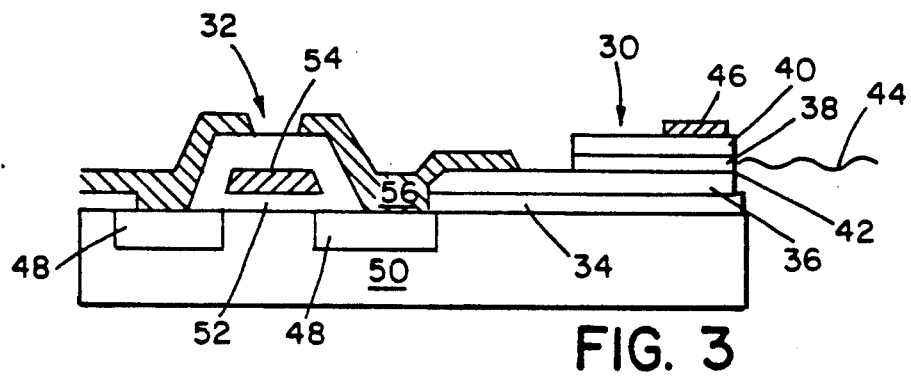
FIG. 3
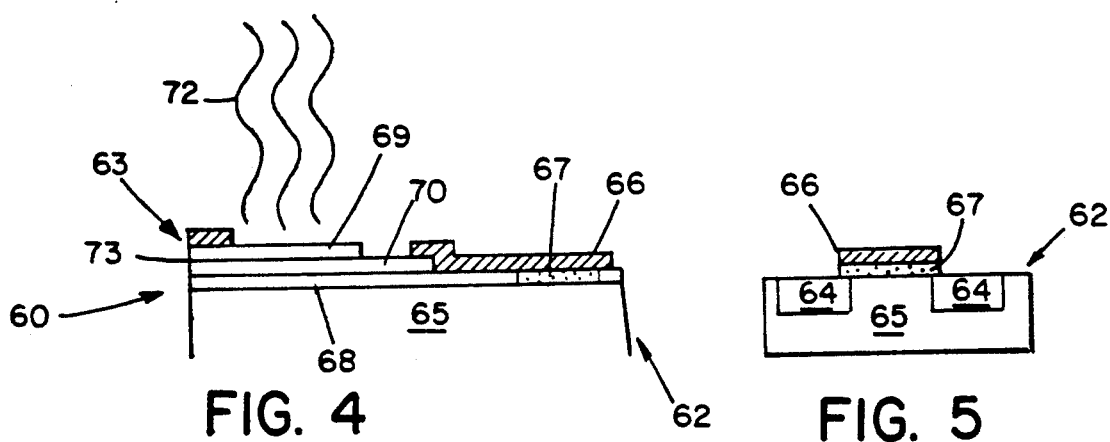
FIG. 4
FIG. 5
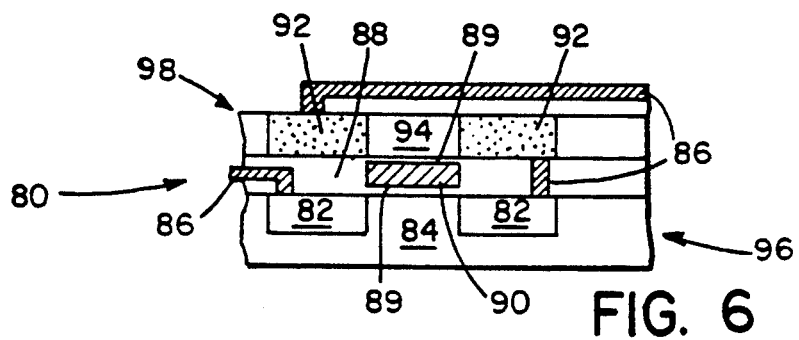
FIG. 6

CHEMICAL METHOD FOR THE MODIFICATION OF A SUBSTRATE SURFACE TO ACCOMPLISH HETEROEPITAXIAL CRYSTAL GROWTH

This is a continuation of copending application Ser. No. 07/367,459 filed on Jun. 16, 1989, now abandoned.

BACKGROUND

This invention provides a chemical method for the modification of a substrate surface to accomplish heteroepitaxial crystal growth.

The development of new device isolation geometries requires a process to grow semiconducting materials on insulating surfaces. To this end, significant efforts have been directed toward the growth of semiconductors on insulators. Much of this work has been devoted to the growth of silicon (Si) on amorphous silicon dioxide (Atwater et al, Appl. Phys. Lett. 43, 1126–1128 (1983)) and include elaborate seeding techniques to achieve overgrowth of the crystalline silicon. Although this silicon/silicon dioxide interface has acceptable electronic properties, the crystalline perfection of the silicon overgrowth has been inadequate for fabrication of reliable devices.

The heteroepitaxial growth of silicon on sapphire substrates has also been investigated (Ishida et al, J. Appl. Phys. 64, 2087–2091 (1988) and Nakata et al, U.S. Pat. No. 4,546,376.) This silicon/sapphire combination eliminates the need for incorporating a seeding geometry since the sapphire substrate is crystalline. However, these epitaxial layers are characterized by a high density of crystalline defects which result from the large lattice mismatch and difference in thermal expansion coefficients of silicon and sapphire.

Another method to accomplish the growth of a semiconductor (e.g. Si) on an insulating substrate, while avoiding the lattice constant and thermal expansion coefficient mismatch characteristic of the silicon/sapphire system, involves irradiation of a semiconductor substrate so that its bulk becomes semi-insulating, while it retains a semiconducting surface layer (U.S. Pat. No. 4,469,527).

Growth of heteroepitaxial multiconstituent material on a substrate (U.S. Pat. No. 4,477,308) has been accomplished by deposition of a thin layer of a "template forming material" which contains at least one constituent of the multiconstituent material to be grown, but differs from the composition of the substrate. The "template forming material" and substrate are then heated so that the "template forming material" reacts to form a "template material", usually a material having essentially the same composition as the multiconstituent material to be deposited on this "template material".

Recently, interest has shifted to the alkaline earth fluoride compounds (calcium fluoride, strontium fluoride, and barium fluoride) as insulating surfaces for heteroepitaxial crystal growth (Fathauer et al, J. Appl. Phys. 60, 3886–3894 (1986)). These are promising materials because they enable the growth of lattice-matched semiconductor-on-insulator (SOI) structures, FIG. 1 (Zogg et al, J. Electrochem. Soc. 136, 775–779 (1989)).

Although the reliability issues can be solved by the use of appropriate materials combinations, the growth of semiconducting material on low surface energy insulating material is difficult on general thermodynamic grounds (Himpsel et al, Materials Science & Engineering B1, 9–13 (1988)). Without special surface preparation steps, the semiconductor grows in the form of isolated three-dimensional islands.

A technique for two-dimensional epitaxial growth on fluoride compounds has been reported in the literature. It involves exposing the substrate to a beam of electrons and was shown to improve vastly the growth behavior of germanium (Kanemura et al, J. Appl. Phys. 63, 1060–1064 (1988)) and of gallium arsenide (Furukawa et al, Proc. 1988 International Electronic Devices and Materials Symp., Department and Institute of Electrical Engineering, National Sun Yat Sen University, Kaohsiung, Taiwan, 266–269 (1988)) on calcium fluoride.

SUMMARY OF THE INVENTION

According to the invention, a chemical method for the modification of a substrate surface to accomplish heteroepitaxial crystal growth is provided. Our method involves exposing a substrate to an element or compound so that a chemical reaction occurs between the substrate and that element or compound at the substrate surface. It is possible to alter the entire surface of the substrate such that a new surface, possessing higher surface energy, is created for subsequent heteroepitaxial crystal growth. High substrate surface energy discourages the formation of three dimensional islands, thus enabling two dimensional epitaxial growth.

This chemical method does not require high vacuum conditions and can be incorporated easily in a metal organic chemical vapor deposition (MOCVD) process as well as in other commonly used crystal growth techniques. MOCVD is presently the most promising crystal growth technique for the mass production of epitaxially grown films.

The chemical method of the invention for growth of semiconducting layers on insulating compounds will improve the performance of existing devices and allow commercial fabrication of new device structures presently in a conceptual stage.

This invention has significant implications for the fabrication of a charge storage device for a dynamic random access memory (DRAM) chip. Present state-of-the art memory chips (4 megabit DRAMs) incorporate a horizontal field effect transistor (FET) and a vertical capacitor. The next generation of DRAMs requires reduction of chip area occupied by these devices.

The capability to fabricate an entirely vertical device will greatly minimize the surface area occupied by the device, allowing for high device density. Such a structure can be formed using isolation techniques involving the SOI technology enabled by this invention.

BRIEF DESCRIPTION OF THE DRAWING

In the drawing:

FIG. 2 is a sideview of a dynamic random access memory (DRAM) storage cell.

FIG. 3 is a sideview of an integrated diode laser and field effect transistor (FET) utilizing an insulating fluoride buffer layer.

FIG. 4 is a frontview of an integrated detector and FET.

FIG. 5 is a sideview of the FET of an integrated detector and FET.

FIG. 6 is a sideview of a complementary metal oxide semiconductor (CMOS) inverter.

DESCRIPTION OF THE PREFERRED EMBODIMENTS

Figure 1:
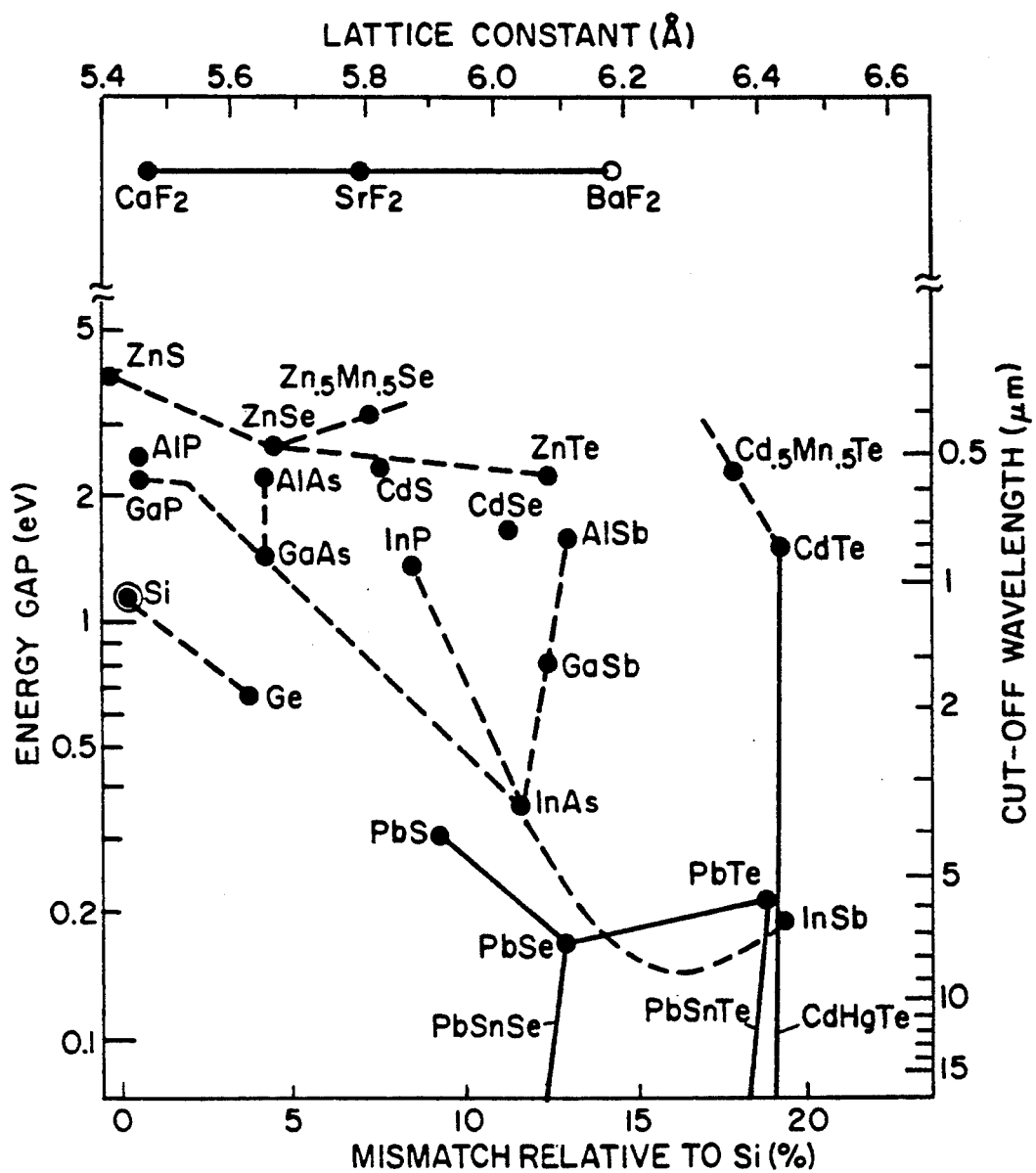
FIG. 1 is a graph showing bandgap as a function of lattice parameter for various semiconductors.

Many semiconductor-based technologies will benefit from the ability to grow high quality semiconducting layers on insulating surfaces. These devices include high density dynamic random access memory (DRAM) chips, circuits based on complementary metal oxide semiconductor (CMOS) circuits, and chips incorporating optoelectronic devices for fiber optic communication.

FIG. 2 shows a charge storage device 10 that can be fabricated using this invention. This charge storage device 10 can be used in the memory cell array of a DRAM, not shown. The fabrication sequence for this charge storage device 10 consists of growing a semiconducting layer 12 which can be n type on a layer of insulator 14 which can be an alkaline earth fluoride such as calcium fluoride, strontium fluoride or barium fluoride previously grown on a crystalline substrate 16 which can be a silicon wafer. A patterning step using conventional masking and etching technology is then performed to define a capacitor 18. Layers of p type semiconducting material 20, and n-type semiconducting material 22 are grown. Layers of conducting material are deposited to define a bit line 24 and a word line 26. These layers 20, 22, 24 and 26 are patterned such that a vertical FET 28 is formed.

In a preferred embodiment shown in FIG. 2, the FET 28 is an n channel transistor with a gate dielectric 25 which can be any insulator including $SiO_2$ or an alkaline earth fluoride and whose gate is the wordline 26.

An advantage of this FET 28 structure is its vertical geometry which minimizes the area occupied by the device. Also important is capacitor 18 isolation provided by insulator 29 from surrounding p- and n-type semiconducting materials 20 and 22 which minimizes discharge probability due to ionizing radiation. With advances in lithography, this device structure will become a key element in 256 megabit to 64 gigabit DRAMs.

FIG. 3 shows a diode laser 30 integrated with an FET transistor 32. The diode laser 30 is isolated from the FET transistor 32 by a layer of insulating material 34 which may be an alkaline earth fluoride such as calcium fluoride, strontium fluoride or barium fluoride. This layer of insulating material 34 acts as "buffer layer" and allows the joining of dissimilar semiconducting materials.

The diode laser 30 is composed of a layer of n-type semiconducting material 36 such as PbSeTe which is grown on the insulator 34 using the method of the invention. A layer of p-type semiconducting material 38 such as PbSnSeTe is grown above the n-type semiconducting material 3. A layer of p-type semiconducting material 40 such as PbSeTe is grown above the p-type semiconducting material 38. A junction 42 between the n-type semiconducting material 36 and the p-type semiconducting material 38 constitutes the active region of the diode laser 30 and it is from this active region that radiation represented by a sinusoid 44 is emitted. Electrical contact is made to the diode laser 30 by a layer of conductive metallization 46 which can be gold.

The FET transistor 32 is fabricated by diffusing two n-type regions 48 in a p-type silicon substrate 50. A gate dielectric 52 may consist of thermally grown silicon dioxide and a gate 54 may be deposited aluminium. A conductive metallization layer 56 connects the n-type regions 48 with the n-type layer 36 of the diode laser 30.

The integration of optoelectronic devices with other electronic devices will allow monolithic integration of fiber optic communication architectures with VLSI processor chips. For example, in the next generation of 64 bit microprocessor chips, the number of input/output contacts can be drastically reduced by multiplexing signals though one laser. Such a configuration will offer significant reliablity advantages.

FIG. 4 shows a diode detector/FET 60 structure which is used to receive signals. The diode detector/FET 60 consists of an FET transistor 62 and a diode detector 63.

The FET 62 is an n-channel transistor in a preferred embodiment shown in FIGS. 4 and 5. The FET 62 is fabricated by creating two n-type regions 64 in a p-type silicon substrate 65. A gate 66 for the FET 62 may consist of deposited aluminium. A layer of thermally grown silicon dioxide 67 forms the gate dielectric.

The diode detector 63 (FIG. 4) is fabricated on a layer of insulator 68 which may consist of an alkaline earth fluoride such as barium fluoride, which is grown upon a p-type silicon substrate 65. A p-type semiconductor layer 69 which may be PbPmSeTe and an n-type semiconductor layer which may be PbSeTe for lattice matching to $BaF_2$ 70 are all grown above the insulator layer 68. The heteroepitaxy of the n-type semiconductor layer 70 on the insulator layer 68 is accomplished using the method of the present invention.

The insulator substrate may also be composed of a binary or ternary alloy of any of the alkaline earth fluorides to achieve a particular lattice match between it and the heteroepitaxial semiconductor overgrowth (see FIG. 1).

Light represented by sinusoids 72 impinges upon the surface of the p-type semiconductor layer 69. The active region of the device is a junction 73 between the p-type semiconductor layer 69 and the n-type semiconductor layer 70.

FIG. 6 shows a CMOS inverter 80, one of the most common circuit elements in logic design and a natural candidate for three-dimensional integration. The availability of such a three-dimensionally integrated CMOS inverter 80 will greatly simplify circuit layouts, allowing greater device density.

A CMOS inverter 80 is fabricated by creating diffused n-type regions 82 in a p-type silicon substrate 84 and complementary p-type diffusions 92 in n-type silicon 94. Electrical contact is made to the n-type regions 82 and p type regions 92 by conductive layers 86 which may consist of aluminium. A layer of insulator which may consist of $BaF_2$, $CaF_2$, $SrF_2$ 88 is deposited above the n-type regions 82 and the p-type region 84. The insulator layer 88 also serves as gate dielectrics 89. A common gate 90 is provided and may be a silicide such as $TiSi_2$, $CoSi_2$. Above the insulator layer 88, p-type regions 92 are grown. The p-type regions 92 are separated by an n-type region 94. The chemical surface modification of the present invention enables the growth of the p-type semiconductor layers 92 and the n-type semiconductor layer 94 above the insulator layer 88 and gate dielectric 89. This CMOS inverter consists of a complementary n-channel FET 96 and p-channel FET 98.

Figure 7:
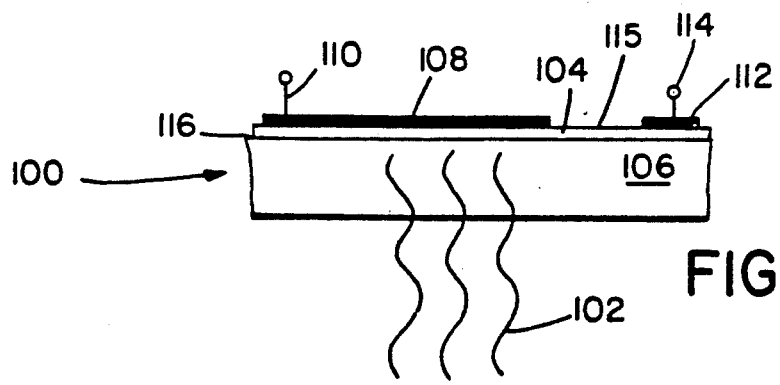
FIG. 7 is a sideview of a detector employing through-the-substrate illumination.

FIG. 7 shows an infrared detector 100 whose fabrication depends on SOI technology. This infrared detector 100 permits illumination, represented by sinusoids 102, through a transparent insulating substrate which may be barium fluoride, calcium fluoride or strontium fluoride. The chemical surface modification of the present invention enables the heteroepitaxy of a semiconductor layer 104 which may be PbSeTe on the transparent insulating substrate 106. A Schottky contact 108 which may be platinum is deposited on the semiconductor layer 104. The Schottky contact 108 is given a negative bias at 110 by an external voltage source not shown. An ohmic contact 112 which may be gold is also deposited on the semiconductor layer 104. The ohmic contact 112 is given a positive bias at 114 by an external source not shown. This device requires no passivation processing step for a surface 115 of the semiconductor layer 104 since the active area at the semiconductor/substrate interface 116 is already passivated by the transparent insulating substrate 106. This device can be easily encapsulated because the transparent insulating substrate 106 doubles as a window.

EXAMPLE 1

Semiconductor on insulator structures have been fabricated using the chemical surface modification technique of the invention. Layers of lead selenide (PbSe) were grown on both (111) and (100) oriented barium fluoride (BaF$_2$) substrates.

The (111) oriented substrates were prepared by cleaving, whereas the (100) oriented substrates were cut and polished. The final polishing step involves immersing the substrate in stirred water for about 90 minutes. Since BaF$_2$ is slightly water soluble, this immersion removes the damaged surface layer resulting from the previous polishing step.

Figure 8:
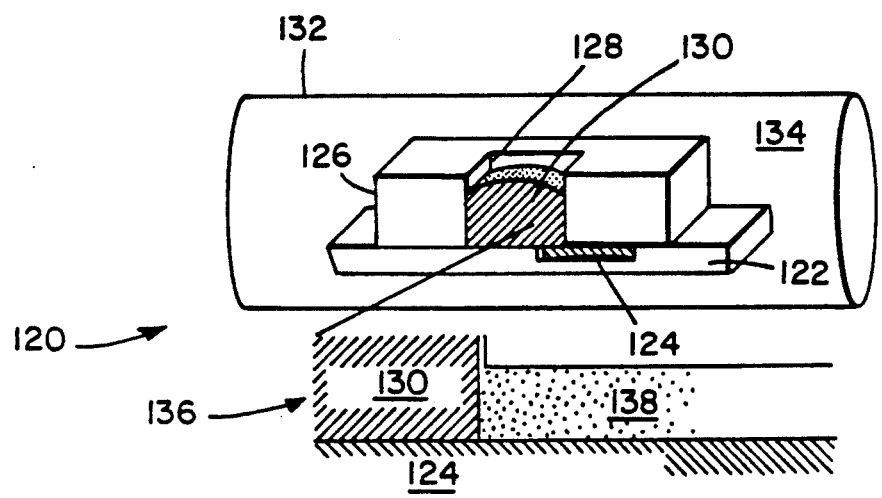
FIG. 8 is a sideview of a reactor for liquid phase epitaxy (LPE) growth with an expanded sideview of the growth interface.

As part of a liquid phase epitaxy growth process, the BaF$_2$ substrate surface was exposed to selenium vapor prior to initiation of actual LPE growth of the semiconducting PbSe layer (FIG. 8).

A typical apparatus 120 for conducting a liquid phase epitaxy growth process 120 is shown FIG. 7. A graphite slider 122 supports a barium fluoride substrate 124 whereupon heteroepitaxy is conducted. The graphite boat 126 consists of the slider 122 which is passed beneath a well 128, containing a molten growth solution (130) (Pb$_{1-x}$Se$_x$) where typically $x < 0.04$.

Lead selenide is the compound which is epitaxially grown on the barium fluoride substrate 124. The graphite boat 126 and graphite slider 122 are contained within a quartz tube 132 wherein a hydrogen ambient 134 is maintained at atmospheric pressure.

Since the vapor pressure of selenium is considerably higher than the vapor pressure of lead, the barium fluoride substrate 124, shown in greater detail in an expanded view 136, is exposed to a selenium-containing vapor 138, as it is pulled beneath the growth solution 130. Growth is initiated by pulling the BaF$_2$ substrate 124 under the molten growth solution 130 while the furnace is cooling. Complete surface reaction is obtained at growth initiation temperatures above 620° C.

Figure 9:
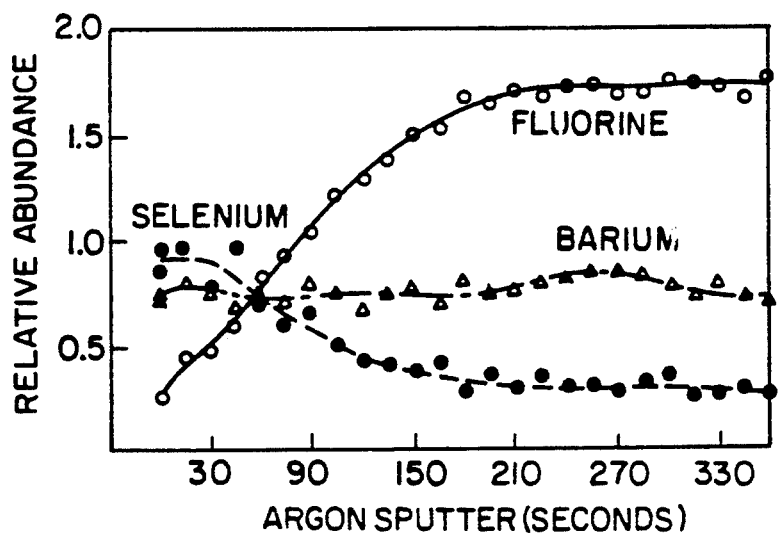
FIG. 9 is an Auger electron spectroscopy (AES) profile through the surface of a $BaF_2$ substrate after exposure to hydrogen selenide vapor.
Figure 11:
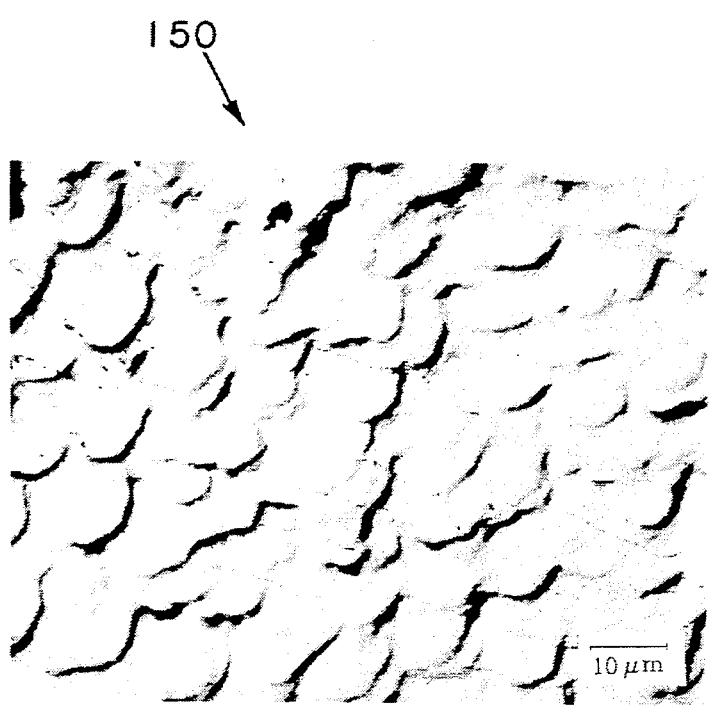
FIG. 11 is an optical micrograph showing surface morphology of a PbSeTe lattice-matched layer on a (100) $BaF_2$ substrate, prepared according to the invention.

The reaction which occurs between the selenium-containing vapor 138 and the BaF$_2$ substrate 124 is confirmed by Auger electron spectroscopy (AES), (FIG. 8) and optical microscopy (FIG. 11). The AES profile of FIG. 9 indicates that the binary compound BaSe is formed at the BaF$_2$ substrate surface as fluorine is replaced by selenium via a chemical reaction.

Figure 10:
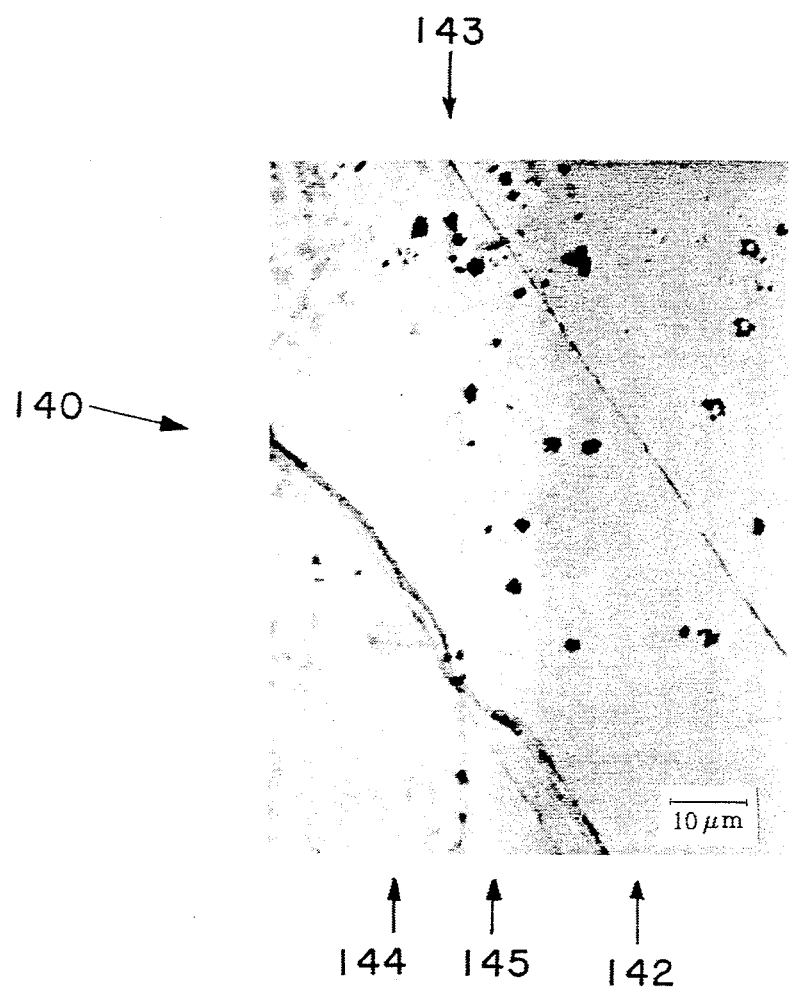
FIG. 10 is an optical micrograph of a $BaF_2$ substrate, which has been exposed to hydrogen selenide vapor.

FIG. 10 is an optical micrograph 140 showing a BaF$_2$ substrate that has been exposed to selenium vapor. A right side 142 was covered by a small piece of BaF$_2$ not shown. A line 143 indicates the boundary between the covered right side 142 and an exposed left side 144. This right side 142 of the substrate was not exposed to the molten growth solution.

The temperature of the furnace was kept above the liquidus temperature of the growth solution so that a PbSe layer would not grow on the substrate. The exposed left side 144 of the substrate shows evidence of a reaction product. A small region 145 near the line 143 shows evidence of a reaction where selenium vapor penetrated beneath the small piece of BaF$_2$. The presence of the BaSe reaction product is demonstrated by AES profile of FIG. 9.

Surface morphologies of PbSe layers grown on BaF$_2$ substrates are indistinguishable from layers grown on PbSe substrates. Measured electron Hall mobilities of the epitaxial PbSe layers are comparable to those measured in bulk PbSe material (Table 1). The slightly lower mobility measured in our epitaxial layers may be due to scattering at the rough semiconductor/substrate interface produced by the current substrate surface preparation technique. Growth on smooth BaF$_2$ surfaces should yield PbSe layers exhibiting higher electron Hall mobilities.

These structures are suitable for fabrication of Schottky barrier detectors of the type shown in FIG. 7. Their performance should compare favorably with commercially available devices.

TABLE 1

| Electron Hall Mobilities (300 K) | |
| --- | --- |
| LPE PbSe/(100)BaF$_2$ (this work) | 965 cm$^2$/V/sec |
| Bulk PbSe* | 1200 cm$^2$/V/sec |

*R. Dalven, "A Review of the Semiconductor Properties of PbTe, PbSe, PbS, and PbO," Infrared Physics, 9, pp. 141-184, 1969.

EXAMPLE 2

Lead selenide telluride (PbSeTe), a IV-VI compound semiconductor, with a band gap of 280 meV at 300K, was also grown. PbSeTe has a well matched thermal expansion coefficient to BaF$_2$.

More precisely, the alloy that we have grown has the composition PbSe$_{0.78}$Te$_{0.22}$, which has the same lattice parameter as BaF$_2$, as indicated in FIG. 1. The choice of a IV-VI compound semiconductor is preferred over other semiconductors because of this very good match.

Therefore, it is possible to grow epitaxial layers with a semiconductor/insulator interface free from dislocations based on PbSe$_{0.78}$T$_{0.22}$/BaF$_2$. This dislocation-free interface can remain essentially dislocation-free upon thermal cycling because of the nearly identical match of thermal expansion coefficients (Table 2).

FIG. 11 shows the surface morphology of a pbSeTe lattice-matched layer on (100) BaF$_2$. A terraced surface 150 of the epitaxial layer is typical of LPE growth on a slightly misoriented substrate.

TABLE 2

| Thermal Expansion Coefficients Near 300 K | |
|---|---|
| CaF$_2$ | 1.9 × 10$^{-5}$ per Kelvin |
| SrF$_2$ | 1.8 × 10$^{-5}$ |
| BaF$_2$ | 1.8 × 10$^{-5}$ |
| PbSe | 1.9 × 10$^{-5}$ |
| PbTe | 2.0 × 10$^{-5}$ |
| GaAs | 5.6 × 10$^{-6}$ |
| Si | 2.5 × 10$^{-6}$ |

(S. Furukawa, et al., Proc. 1988 International Electronic Devices and Materials Symp., Department and Institute of Electrical Engineering, National Sun Yat-Sen University, Kaohsiung, Taiwan, 266-269 (1988); H. Holloway, Physics of Thin Films, 11, 116 (1980)).

What is claimed is:

1. A liquid phase epitaxy method for heteroepitaxial crystal growth comprising:
   exposing an insulating substrate characterized by a substrate chemical composition and selected from the group consisting of barium fluoride, strontium fluoride, calcium fluoride and alloys thereof to a reactive substance characterized by a reactive substance chemical composition which reacts chemically with said substrate and wherein said reactive substance includes a Group VI element selected from the group consisting of oxygen, sulfur, selenium and tellurium under conditions sufficient to react with said substrate to form a compound layer on said substrate wherein said compound layer is further characterized by a compound layer chemical composition different from said substrate chemical composition and different from said reactive substance chemical composition followed by growing a heteroepitaxial crystalline layer which is a compound semiconductor including a first element selected from the group consisting of carbon, silicon, germanium, tin and lead and a second element selected from the group consisting of oxygen, sulphur, selenium and tellurium on said compound layer by liquid phase epitaxy.

2. The method of claim 1 wherein said reactive substance is a vapor.

3. The method of claim 2 wherein said vapor includes a vapor constituent and said substrate includes a substrate constituent and said compound layer is formed of a vapor constituent and a substrate constituent.

4. The method of claim 1 wherein said heteroepitaxial crystalline layer includes a heteroepitaxial crystalline layer constituent and said compound layer contains a heteroepitaxial crystalline layer constituent.

5. The method of claim 1 wherein said compound layer is further characterized by a compound layer crystal structure and said heteroepitaxial crystalline layer is further characterized by a heteroepitaxial crystalline layer crystal structure and said heteroepitaxial crystalline layer crystal structure is the same as said compound layer crystal structure.

6. The method of claim 1 conducted at atmospheric pressure.

7. The method of claim 2 wherein said vapor is a vapor compound of said Group VI element and at least one other element.

8. The method of claim 7 wherein said vapor compound is a hydrogen chalcogenide vapor compound selected from the group consisting of hydrogen sulphide, hydrogen selenide and hydrogen telluride.

9. The method of claim 1 wherein said compound layer has a higher surface energy than said insulating substrate.

10. The method of claim 1 wherein said substrate chemical composition includes a substrate anion and a substrate cation and said vapor is a vapor compound including a vapor cation and a vapor anion and said compound layer comprises said substrate cation and said vapor anion.

11. The method of claim 10 wherein said vapor anion is less electronegative than said substrate anion.

12. A method for heteroepitaxial crystal growth comprising:
   (1) pre-treating a polished (100) oriented barium fluoride substrate characterized by a damaged surface layer by etching said (100) oriented barium fluoride substrate in stirred water for ninety minutes at 25° C.;
   (2) exposing and polished (100) oriented barium fluoride substrate characterized by a (100) oriented barium fluoride substrate composition to a reactive substance characterized by a reactive substance composition to react with said polished (100) oriented barium fluoride substrate to form a compound layer on said (100) oriented barium fluoride substrate wherein said compound layer is characterized by a compound layer composition which differs from said reactive substance composition and said polished (100) oriented barium fluoride substrate composition and said compound layer composition includes a constituent of said polished (100) oriented barium fluoride substrate; and
   (3) growing a heteroepitaxial crystalline layer on said compound layer.

13. A method for heteroepitaxial crystal growth of a semiconductor on insulator structure comprising:
   (1) providing an insulator substrate characterized by a substrate composition;
   (2) providing a molten growth solution of a semiconductor characterized by a liquidus temperature and a growth solution composition and having a volatile component;
   (3) heating said molten growth solution to a temperature above said liquidus temperature;
   (4) exposing said insulator substrate to said volatile component so that a reaction occurs between said insulator substrate and said volatile component to form a reaction compound layer having a reaction compound layer composition different from said substrate composition and said growth solution composition on said insulator substrate;
   (5) cooling said molten growth solution below said liquidus temperature to form a cooled molten growth solution; and
   (6) exposing said insulator substrate to said cooled molten growth solution so that an epitaxial semiconductor layer is formed on said reaction compound layer.

14. The method of claim 13 wherein said insulator substrate is BaF$_2$, said molten growth solution is a solution including Pb and Se, said volatile component is Se vapor, said reaction compound layer is BaSe and said epitaxial semiconductor layer is a compound containing Pb and Se.

15. The method of claim 14 wherein said molten growth solution is a Pb$_{1-x}$Se$_x$ solution wherein x < 0.04.

16. The method of claim 13 wherein said insulator substrate is $BaF_2$, said molten growth solution includes Pb, Se and Te, said volatile component is a vapor selected from the group consisting of Se and Te vapors and compounds and mixtures thereof, said reaction compound layer is a compound containing Ba, Se and Te and said epitaxial semiconductor layer is a compound containing Pb, Se and Te.

17. The method of claim 13 wherein said insulator substrate is (100) oriented barium fluoride characterized by a damaged surface layer and further comprising a step of pre-treating said polished (100) oriented barium fluoride by exposing said (100) oriented barium fluoride to stirred water for ninety minutes at 25° C. to dissolve said damaged surface layer.

18. The method of claim 1 wherein said insulating substrate is a polished (100) oriented barium fluoride substrate further characterized by a damaged surface layer and further comprising a step of pre-treating said polished (100) oriented barium fluoride substrate by etching said (100) oriented barium fluoride substrate in stirred water for ninety minutes at 25° C. to dissolve said damaged surface layer.

19. The method of claim 13 wherein said volatile component include a vapor constituent and said insulator substrate includes a substrate constituent and said reaction compound layers is formed of said vapor constituent and said substrate constituent.

20. The method of claim 13 wherein said epitaxial semiconductor layer includes an epitaxial semiconductor layer constituent and said reaction compound layer contains said epitaxial semiconductor layer constituent.

21. The method of claim 13 wherein said reaction compound layer is further characterized by a compound layer crystal structure and said epitaxial semiconductor layer is further characterized by an epitaxial semiconductor layer crystal structure and said epitaxial semiconductor layer crystal structure is the same as said reaction compound layer crystal structure.

* * * * *

UNITED STATES PATENT AND TRADEMARK OFFICE
CERTIFICATE OF CORRECTION

PATENT NO. : 5,310,696
DATED : May 10, 1994
INVENTOR(S) : Patrick J. McCann, et. al.

It is certified that error appears in the above-indentified patent and that said Letters Patent is hereby corrected as shown below:

Title page, item [75], inventors: after "Patrick J. McCann", insert -- Norman, Oklahoma--; and item [75], change "Glifton" to -- Clifton--; also delete "both of"--.
Column 3, line 29: change "n type" to --n-type--.
Column 3, line 42: change "n channel" to -- n-channel--.
Column 3, line 67: change "3" to -- 36 --.
Column 4, line 36: change "PbPmSeTe" to -- PbSeTe --.
Column 5, line 51: change "7" to -- 8 --.
Column 5, line 56: change "X" to -- x --.
Column 6, line 5 : change "8" to -- 9 --.
Column 6, line 6 : change "11" to -- 10 --.
Column 6, line 52: change "." to -- , --.
Column 6, line 63: change "$PbSe_{0.78}T_{0.22}$" to -- $PbSe_{0.78}Te_{0.22}$--.
Column 6, line 67: change "pbSeTe" to -- PbSeTe --.
Column 10, line 5: change "include" to -- includes --.
Column 10, line 7: change "layers" to -- layer --.
Column 2, line 11: change "Yat Sen" to -- Yat-Sen --.

Signed and Sealed this

Twentieth Day of September, 1994

*Attest:*

BRUCE LEHMAN

*Attesting Officer*     *Commissioner of Patents and Trademarks*